(12) United States Patent
Radosavljevic et al.

(10) Patent No.: US 11,222,982 B2
(45) Date of Patent: Jan. 11, 2022

(54) METHODS AND APPARATUS TO FORM SILICON-BASED TRANSISTORS ON GROUP III-NITRIDE MATERIALS USING ASPECT RATIO TRAPPING

(71) Applicant: Intel Corporation, Santa Clara, CA (US)

(72) Inventors: Marko Radosavljevic, Portland, OR (US); Sansaptak Dasgupta, Hillsboro, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 9 days.

(21) Appl. No.: 16/321,356

(22) PCT Filed: Sep. 29, 2016

(86) PCT No.: PCT/US2016/054480
§ 371 (c)(1),
(2) Date: Jan. 28, 2019

(87) PCT Pub. No.: WO2018/063252
PCT Pub. Date: Apr. 5, 2018

(65) Prior Publication Data
US 2019/0181265 A1 Jun. 13, 2019

(51) Int. Cl.
*H01L 21/8258* (2006.01)
*H01L 29/78* (2006.01)
(Continued)

(52) U.S. Cl.
CPC ...... *H01L 29/7851* (2013.01); *H01L 21/8258* (2013.01); *H01L 21/823807* (2013.01); *H01L 21/823821* (2013.01); *H01L 27/0605* (2013.01); *H01L 27/0924* (2013.01); *H01L 29/1054* (2013.01); *H01L 29/2003* (2013.01); *H01L 29/66795* (2013.01)

(58) Field of Classification Search
CPC ............ H01L 29/7851; H01L 29/2003; H01L 27/0924; H01L 27/0605; H01L 21/823807;
(Continued)

(56) References Cited

U.S. PATENT DOCUMENTS

| 5,910,672 A * | 6/1999 | Iwamatsu | H01L 21/84 257/347 |
| 8,350,273 B2 * | 1/2013 | Vielemeyer | H01L 21/02381 257/627 |

(Continued)

FOREIGN PATENT DOCUMENTS

| KR | 20150102332 | 9/2015 |
| WO | 2018063252 | 4/2018 |

OTHER PUBLICATIONS

Sze et al., Physics of Semiconductor Devices, Third Edition, John Wiley & Sons, Inc., 2007, pp. 7-10 (Year: 2007).*

(Continued)

*Primary Examiner* — Shih Tsun A Chou
(74) *Attorney, Agent, or Firm* — Green, Howard & Mughal LLP

(57) ABSTRACT

Methods and apparatus to form silicon-based transistors on group III-nitride materials using aspect ratio trapping are disclosed. An example integrated circuit includes a group III-nitride substrate and a fin of silicon formed on the group III-nitride substrate. The integrated circuit further includes a first transistor formed on the fin of silicon and a second transistor formed on the group III-nitride substrate.

14 Claims, 5 Drawing Sheets

(51) Int. Cl.
*H01L 21/8238* (2006.01)
*H01L 27/092* (2006.01)
*H01L 27/06* (2006.01)
*H01L 29/66* (2006.01)
*H01L 29/10* (2006.01)
*H01L 29/20* (2006.01)

(58) Field of Classification Search
CPC ......... H01L 21/823821; H01L 21/8258; H01L 21/8238; H01L 21/8252; H01L 27/092
See application file for complete search history.

(56) References Cited

U.S. PATENT DOCUMENTS

| | | | |
|---|---|---|---|
| 8,906,796 B2* | 12/2014 | Kambayashi | H01L 29/452 |
| | | | 438/605 |
| 2008/0073667 A1* | 3/2008 | Lochtefeld | H01L 29/66795 |
| | | | 257/190 |
| 2012/0220083 A1* | 8/2012 | Currie | H01L 21/823807 |
| | | | 438/151 |
| 2013/0034943 A1 | 2/2013 | Lochtefeld | |
| 2013/0062696 A1 | 3/2013 | Di et al. | |
| 2014/0217420 A1* | 8/2014 | Kumar | H01L 21/02381 |
| | | | 257/76 |
| 2015/0069517 A1* | 3/2015 | Yang | H01L 21/8238 |
| | | | 257/369 |

OTHER PUBLICATIONS

International Searching Authority, "International Search Report", dated Jun. 21, 2017 in connection with International Application No. PCT/US2016/054480, 4 pages.

International Searching Authority, "Written Opinion of the International Search Authority", dated Jun. 21, 2017 in connection with International Application No. PCT/US2016/054480, 8 pages.

* cited by examiner

METHODS AND APPARATUS TO FORM SILICON-BASED TRANSISTORS ON GROUP III-NITRIDE MATERIALS USING ASPECT RATIO TRAPPING

FIELD OF THE DISCLOSURE

This disclosure relates generally to semiconductors and, more particularly, to methods and apparatus to form silicon-based transistors on group III-nitride materials using aspect ratio trapping.

BACKGROUND

Gallium nitride (GaN) is a semiconductor material that has a relatively wide bandgap. Traditional semiconductor materials such as silicon (Si) and gallium arsenide (GaAs) have a bandgap on the order of approximately 1 to 1.5 electronvolts. By contrast, GaN has a bandgap of approximately 3.4 electronvolts. The relatively high bandgap results in a relatively high breakdown voltage that makes GaN suitable as a substrate for transistors used in high power and/or high frequency applications. However, the nature of GaN is such that the benefits only exist for n-channel transistors while p-channel transistors formed on a GaN substrate exhibit characteristics that are too poor to be acceptable in most applications.

Figure 1:
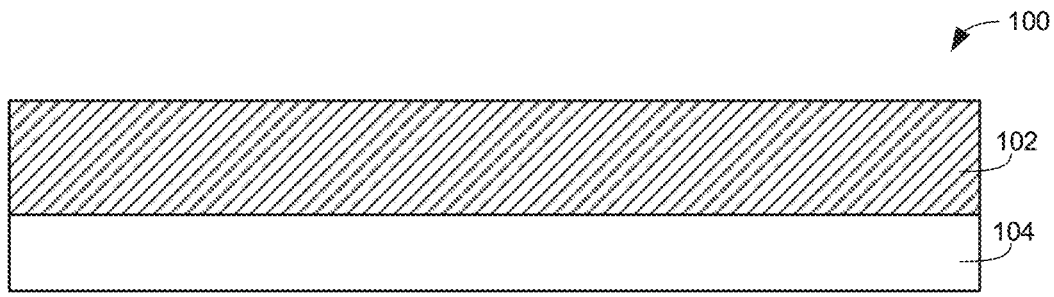
FIGS. 1-5 illustrate progressive stages of fabrication to form GaN-based and Si-based transistors on a single integrated circuit.

The figures are not to scale. Instead, to clarify multiple layers and regions, the thickness of the layers may be enlarged in the drawings. Wherever possible, the same reference numbers will be used throughout the drawing(s) and accompanying written description to refer to the same or like parts. As used in this patent, stating that any part (e.g., a layer, film, area, or plate) is in any way on another part (e.g., positioned on, located on, disposed on, or formed on, above, etc.), means that the referenced part is either in contact with the other part, or that the referenced part is above the other part with one or more intermediate part(s) and/or layer(s) located therebetween. Stating that any part is in contact with another part means that there is no intermediate part and/or layer between the two parts.

DETAILED DESCRIPTION

Power efficiency is an important consideration in many electronic devices. This is especially a concern in mobile devices that rely on a battery to power electrical components. As such, efforts have been made to use nitride based semiconductor materials in integrated circuits (ICs) because they have been shown to exhibit better power efficiency in particular applications including voltage regulation and radio frequency (RF) power amplification than other commonly used semiconductor materials. More particularly, gallium nitride (GaN) used as a semiconductor substrate shows significant benefits over semiconductor substrates made of silicon (Si) or gallium arsenide (GaAs). These benefits are largely due to a significantly higher bandgap in GaN than in other semiconductor materials, which results in a much higher breakdown voltage. However, due to the band structure of GaN, the improved efficiency of GaN-based semiconductor materials only applies to n-channel devices with GaN-based p-channel devices having particularly poor performance characteristics.

The implementation of voltage regulators and RF power amplifiers both require n-channel and p-channel control logic. Thus, while a GaN substrate may be beneficial to form high voltage NMOS transistors (n-channel metal-oxide-semiconductor field-effect transistors), a different semiconductor substrate is needed to form the PMOS transistors (p-channel metal-oxide-semiconductor field-effect transistors) to avoid the poor characteristics of GaN for such p-channel devices. While Si has desirable performance characteristics for PMOS transistors, there are challenges to integrating an Si substrate with a GaN substrate to enable the electrical interconnection of the NMOS and PMOS transistors. Among other things, there is a mismatch in the lattice structures of GaN and Si. As a result, for GaN to be properly formed and processed on a Si wafer, the Si wafer needs to be oriented with the surface along the <111> crystal lattice plane. However, this orientation of Si makes the processing of the Si more difficult than when the Si is oriented with the top surface along the <100> crystal lattice plane in many typical applications. Furthermore, even with the orientation of the Si noted above, the different lattice structures result in the need for a relatively thick epitaxial layer of GaN formed on an Si substrate. The significant height difference between the top surface of the GaN substrate surface and the top surface of the Si surface resulting from the thick GaN layer makes it difficult and/or costly for transistors formed on each surface (e.g., NMOS transistors on the GaN and PMOS transistors on the Si) to be electrically interconnected. For example, GaN epitaxial layers are often grown as thick as 3 micrometers to obtain the desired crystalline structure in the GaN layer. This thickness is significantly larger than individual metallization layers applied to form metal wiring, which have a thickness on the order of 0.1 micrometer (100 nanometers). As a result, it is impractical to form transistors on a layer of GaN (e.g., high power NMOS transistors) on part of a silicon wafer while forming other transistors (e.g., PMOS transistors) directly on the silicon wafer because the transistors will be too far apart to electrically interconnect using normal semiconductor device fabrication processes.

An alternate approach is to manufacture separate chips on separate wafers, each having a different substrate material. For example, one chip is formed with GaN as the substrate for the NMOS transistors and another chip is formed with Si as the substrate for the PMOS transistors. After fabrication of the separate chips, the chips are electrically interconnected via solder bumps on one chip being received at connection points in the other chip. This approach is costly and time consuming because the separate chips must be fabricated during separate processes.

Teachings disclosed herein enable the co-integration of PMOS transistors formed on a Si substrate with high voltage NMOS transistors formed on a GaN-based substrate that are part of a single chip (e.g., on a single semiconductor wafer).

This is made possible through the use of aspect ratio trapping. Aspect ratio trapping involves the geometric design of etched regions in which a crystalline material is formed to trap or stop the propagation of defects within the crystal structure as it is grown.

More particularly, in some examples disclosed herein, aspect ratio trapping is used to grow Si from the surface of an underlying GaN substrate. The cubic nature of the crystal structure of Si when grown on GaN is such that defects within the Si will propagate at approximately 60 degrees with respect to the surface of the GaN substrate. Thus, if the Si is formed within narrow trenches or other region geometrically defined to have a width that is less than half the height of the trench or other region (e.g., an aspect ratio of height to width being at least 2 to 1), any defects within the Si will be arrested (trapped) at the sides of the trench such that further growth of the Si above that point will be substantially defect free. In current finFET (i.e., fin field effect transistor) technology, transistor fins are approximately 10 nanometers wide or less. Thus, using aspect ratio trapping to form a Si fin on a GaN substrate that has trapped any crystal defects would need to be grown to a height of at least 20 nanometers (e.g., twice the desired width). In most applications, the Si fin will need to be somewhat taller to include a working portion of the fin that is substantially free of defects. However, even if the fin is grown to 100 nanometers (i.e., 0.1 micrometers), the height difference between the top of the Si fin and the surface of the GaN is significantly less than the step height (i.e., approximately 3 micrometers) that results from growing GaN on Si using existing semiconductor fabrication methods. With a height difference of substantially less than 1 micrometer, it is possible to form high voltage NMOS transistors on the GaN substrate that can be readily interconnected with PMOS transistors formed on the aspect ratio trapped Si fins to integrate both types of transistors on a single integrated circuit.

FIGS. 1-5 illustrate progressive stages of an example fabrication of an example integrated circuit 100 constructed in accordance with the teachings of this disclosure. FIG. 1 illustrates the formation of the underlying GaN substrate 102 on which transistors are to be formed. In the illustrated example, the GaN substrate 102 is formed on a Si wafer 104. In some examples, the GaN is formed on the Si wafer 104 using a GaN epitaxy approach. The Si wafer 104 may be oriented with its upper surface along the <111> crystal lattice plane and the GaN substrate 102 may be grown to, for example, a thickness of approximately 3 micrometers to achieve a substantially defect-free substrate. Any suitable deposition process may be implemented to form the GaN substrate 102. For example, a thick buffer approach may be used that includes several intermediate layers between the Si wafer 104 and the GaN substrate 102 to transition between the lattice mismatch between the Si and the GaN. In other examples, selective area growth may be used. In other examples, lateral epitaxial overgrowth may be used.

In some examples, the Si wafer 104 may be omitted and the GaN substrate 102 may correspond to an independent wafer. However, under current technology, native GaN substrates are not readily available and are expensive. Thus, in the illustrated example the GaN is formed on the Si wafer 104. The Si wafer 104 is used to form the GaN because Si wafers are commonly used in semiconductor device fabrication. However, any other material with a similar crystal structure could alternatively be used as the foundation to form the GaN substrate 102.

Figure 2:
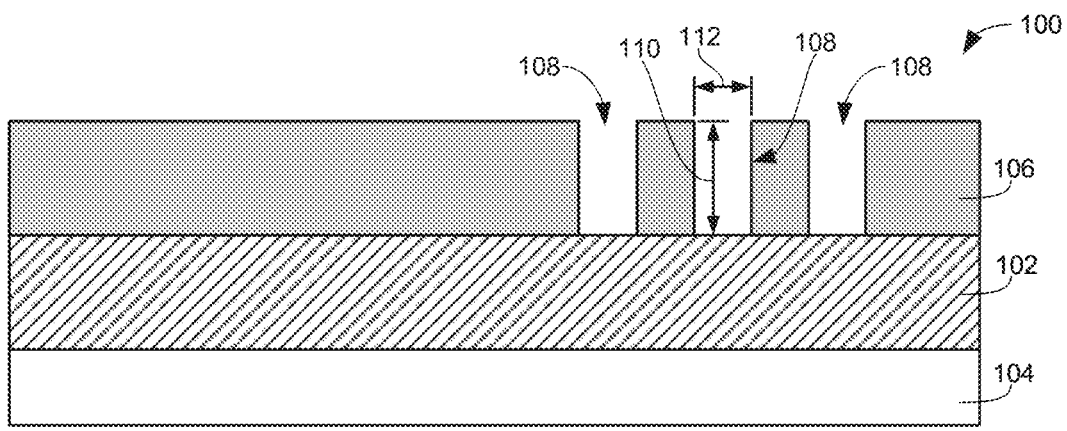
Figure 3:
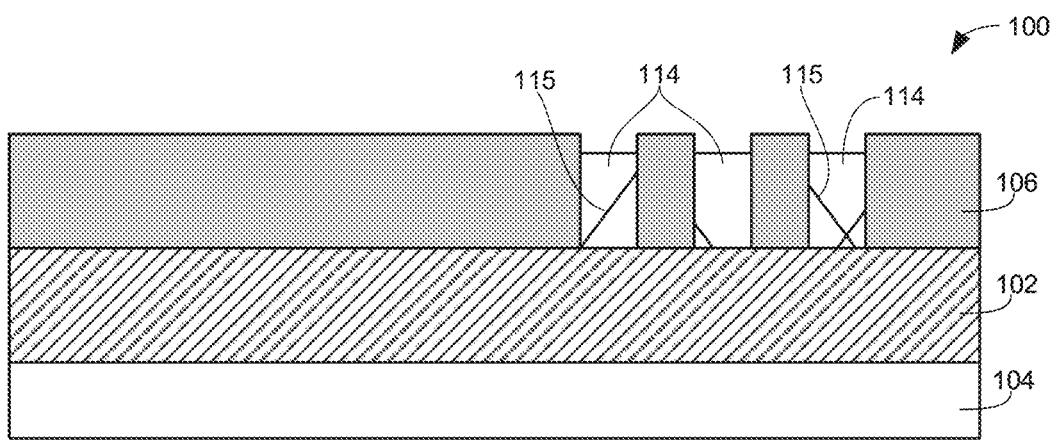

FIG. 2 illustrates the substrate of FIG. 1 after a layer of dielectric material 106 has been added on the GaN substrate 102. The dielectric material 106 may be any suitable insulator such as an oxide or a nitride. More particularly, the dielectric material 106 may be silicon dioxide ($SiO_2$), silicate ($SiO_4$), silicon oxynitride (SiON), etc. Additionally, FIG. 2 shows the dielectric material 106 with regions 108 etched into the dielectric material to expose portions of the GaN substrate 102. In the illustrated example, the etched regions 108 are narrow trenches with a height 110 that is at least twice a width 112 of the trenches. That is, the aspect ratio of height to width of each trench is at least 2:1. The reason for this aspect ratio is shown in FIG. 3 where Si 114 is formed on the exposed surface of the GaN substrate 102 and grown up to the height of the etched regions 108. As shown in FIG. 3, as the Si 114 is formed in the trenches corresponding to the etched regions 108, there may be defects 115 that propagate within the crystal structure. In particular, being cubic in nature, defects in the crystal structure of the Si 114 may form at an angle of approximately 60 degrees to the surface of the GaN substrate 102. The narrow aspect ratio of the etched regions 108 are such that the defects 115 will run into the walls defining the etched regions 108 below the top of the corresponding trench (i.e., region 108) and be trapped from propagating any further. As a result, defects in the Si 114 will be limited to a lower portion 116 of the Si 114 while an upper portion 117 of the Si 114 will be substantially free of crystal defects and, therefore, suitable for use as a substrate for a transistor. Based upon the geometry of the regions 108 and the angle at which the defects 115 will propagate, the lower portion 116 may be defined in the illustrated example as corresponding to a distance that is less than twice the width of the Si 114 (e.g., the width 112 of the regions 108). The upper portion 117 may be defined as the remaining height of the Si 114 above the lower portion 116.

Figure 4:
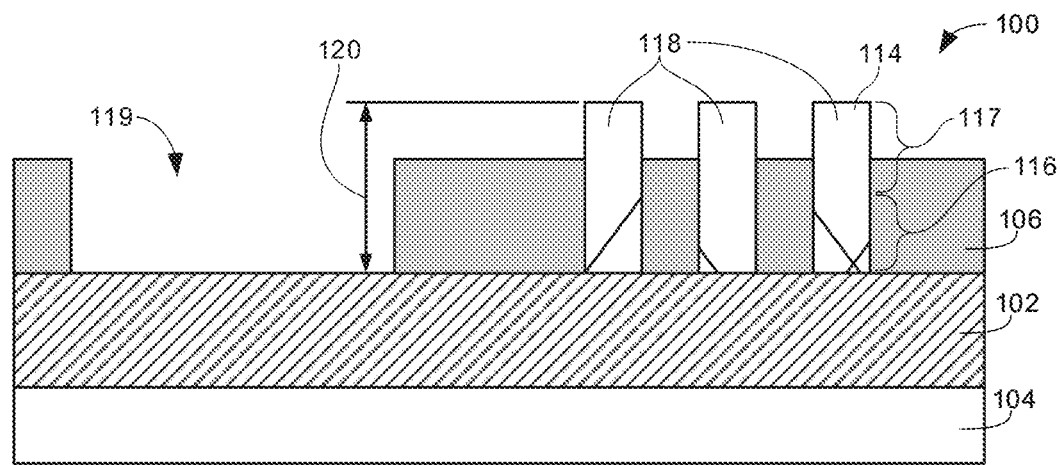

Accordingly, in some examples such as that shown in FIG. 4, the Si 114 is grown an additional extent above where the defects 115 have been trapped to serve as substantially fully crystalline fins 118 for individual transistors. In some examples, the fins 118 may be formed by growing the Si 114 above the top surface of the dielectric material 106 as shown in the example of FIG. 4. In other examples, the dielectric material 106 may reach up to the full height of the final fins 118 with deeper etched regions and even more narrow aspect ratios. In such examples, after the Si 114 is grown within the trenches of the etched regions 108, an upper portion of the dielectric material 106 may be etched away to expose the fully crystalline portion of the fins 118 of Si (e.g., the portion of the Si 114 that is substantially without defects).

Additionally, as shown in FIG. 4, after formation of the Si fins 118, a different region 119 may be etched in the dielectric material 106 to expose the surface of the GaN substrate 102. In some examples, the exposed surface of the GaN substrate 102 is used to form high voltage NMOS transistors while PMOS transistors are formed on the fins 118 of Si. Thus, as shown in the illustrated example of FIG. 4, transistors may be formed on corresponding GaN and Si substrates on a same (i.e., one) wafer with a height difference 120 approximately corresponding to a height of the Si fins 118. The height difference 120 may be significantly less than the approximately 3 micrometer step height of GaN formed on a Si substrate. In some examples, the height different 120 may be substantially less than 1 micrometer. For example, the height difference 120 may be less than or equal to 200 nanometers (0.2 micrometers). In some examples, the height difference 120 may be less than or equal to 100 nanometers (0.1 micrometers). At these relatively small height differences, it is possible to perform back-end-of-line processes to electrically interconnect transistors associated with each semiconductor material formed on a single underlying substrate.

Figure 5:
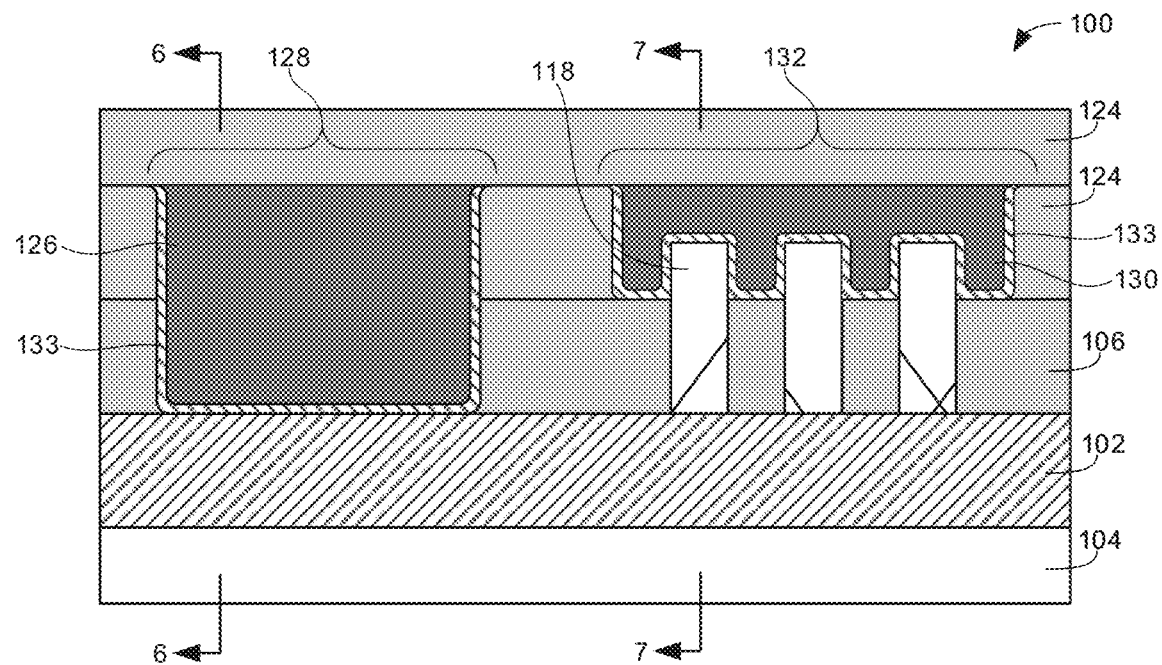

FIG. 5 illustrates the example circuit 100 with completed transistors encased in additional layers of dielectric material 122, 124. More particularly, FIG. 5 shows a first gate 126 for an NMOS transistor 128 formed on the GaN substrate 102 and a second gate 130 for an array of PMOS transistors 132 formed on the Si fins 118. As shown in the illustrated example of FIG. 5, the first and second gates 126, 130 may be separated from the underlying semiconductor substrates 102, 118 by a gate dielectric 133. The gate dielectric 133 may be any suitable high-K dielectric such as, for example, alumina (Al2O3), hafnia (HfO2), zirconia (ZrO2), silicon nitride (Si3N4), etc. In some examples, the materials used to form the gate dielectric 133 for the NMOS transistor 128 may be different than the materials used to form the gate dielectric 133 for the PMOS transistors 132. In the illustrated example, the widths of the transistors 128, 132 are into the drawing with the source and drain for each of the transistors in front and behind the gates 126, 130 from the perspective shown in FIG. 5. For example, a cross sectional view of the NMOS transistor 128 taken along line 6-6 in FIG. 5 is shown in FIG. 6 and a cross sectional view of the PMOS transistors 132 taken along line 7-7 in FIG. 5 is shown in FIG. 7.

Figure 6:
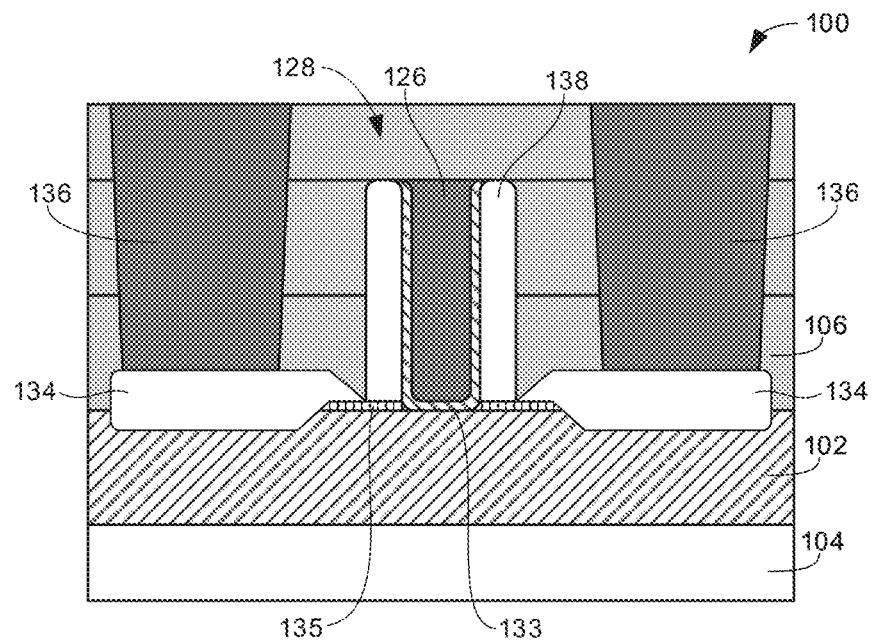
FIG. 6 is a cross-sectional view of the integrated circuit of FIG. 5 taken along the le line 6-6.

As shown in the illustrated example of FIG. 6, the NMOS transistor 128 is formed on the GaN substrate 102 with regions of indium gallium nitride (InGaN) 134 on either side of the gate 126 serving as the source and drain for the transistor. In other examples, a different design for the NMOS transistor 128 including a different material and/or shape for the source, drain, and/or gate 126 may be implemented. A polarization layer 135 may be placed between the regions of InGaN 134 to induce charges and reduce the overall resistance of the transistor 128. As shown in the illustrated example, the polarization layer 135 has been removed where the gate dielectric 133 and gate 126 are formed. In other examples, a thin portion of the polarization layer 135 may be retained beneath the gate dielectric 133. Example materials for the polarization layer 135 include aluminum nitride based materials (e.g., aluminum gallium nitride (AlGaN), aluminum indium nitride (AlInN), etc.).

Figure 7:
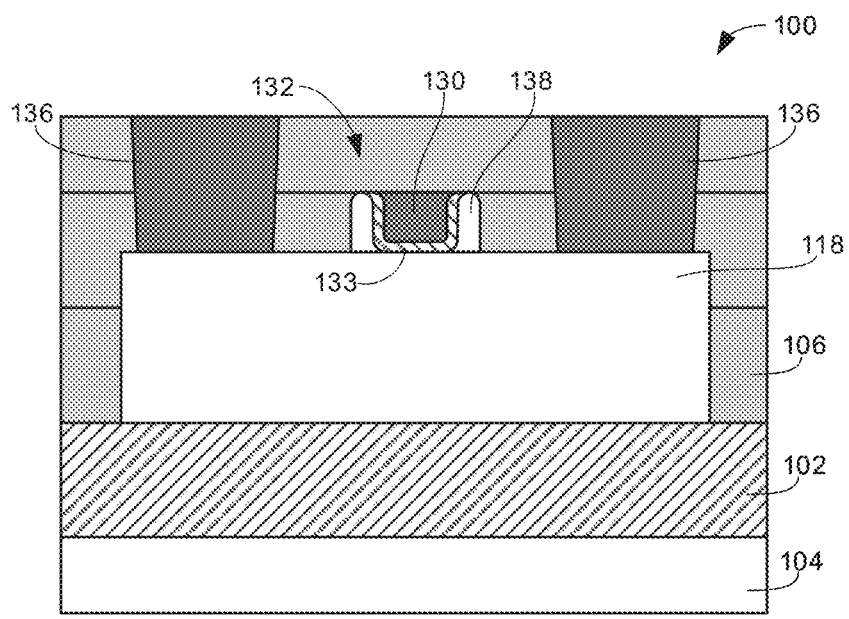
FIG. 7 is a cross-sectional view of the integrated circuit of FIG. 5 taken along the le line 7-7.

As shown in the illustrated example of FIG. 7, the PMOS transistor 132 is formed on a fin 118 with the gate 130 separating a source and drain corresponding to doped regions of the fin 118. In both FIG. 6 and FIG. 7, metal wiring or contacts 136 are added to the sources and drains of each of the transistors 128, 132. In some examples, additional layers of metal wiring 136 may be applied to electrically interconnect the transistors 128, 132. The metal wiring 136 may be any suitable metal (e.g., aluminum (Al), copper (Cu), etc.). As shown in the illustrated examples, the gates 126, 130 are separated from the corresponding semiconductor substrates 102, 118 by the gate dielectric 133. Furthermore, as shown in both FIGS. 6 and 7, the gate dielectric 133 on the sides of the gates 126, 130 may be separated from the contacts or metal wiring 136 by spacers 138 formed of any suitable dielectric material (e.g., an oxide).

In some examples, the height difference 120 (FIG. 4) between the transistors 128, 132 is sufficiently small to enable the application of the metal wiring 136 for both the NMOS transistor 128 on the GaN substrate 102 and the PMOS transistor 132 on the Si fins 118 during the same process. In this manner, high voltage NMOS transistors, beneficial for voltage regulation or RF power amplification, may be readily integrated with PMOS transistors on a single chip (e.g., on a single semiconductor wafer).

In some examples, different semiconductor materials other than those described above may be used in accordance with teachings disclosed herein. For example, while GaN is described as the substrate in FIGS. 1-7, other group III-nitride materials (e.g., indium gallium nitride (InGaN), aluminum gallium nitride (AlGaN), etc.) may alternatively be used as the basis to the NMOS transistor 128. Further, in some examples, the fins 118 used to form the PMOS transistor 132 may be formed from materials other than Si that have a cubic crystal structure. For example, the fins 118 may be formed from any suitable group IV materials (e.g., silicon (Si), germanium (Ge), or germanium silicon (GeSi) alloys) or group III-V materials (e.g., gallium arsenide (GaAs), indium phosphide (InP), indium arsenide (InAs), gallium antimonide (GaSb), indium antimonide (InSb), and/or various alloys (e.g., InGaAs, GaAsSb, etc.)).

Furthermore, different shapes and/or sizes of the etched regions and/or the transistors formed thereafter may be implemented as appropriate to the particular application. For example, a relatively large trench in the dielectric material 206 spanning all three etched regions 108 in FIG. 2 may be defined to form a relatively large block or pedestal of the Si 114. Thereafter, the large block of the Si 114 may be etched into the multiple individual fins (or any other desired shape) used to form the transistors 132. In such an example, the greater width of the large etched region would result in a proportionately larger height of the dielectric material 106 to maintain the desired aspect ratio needed (e.g., a height at least twice the width) to trap defects 115 by the walls of the etched region of the dielectric material 106. Although this approach will result in a greater height difference 120 between the top surface of the Si 114 and the top surface of the GaN substrate 102, the height difference may be substantially less than the step height of GaN formed on Si known in the art.

Figure 8:
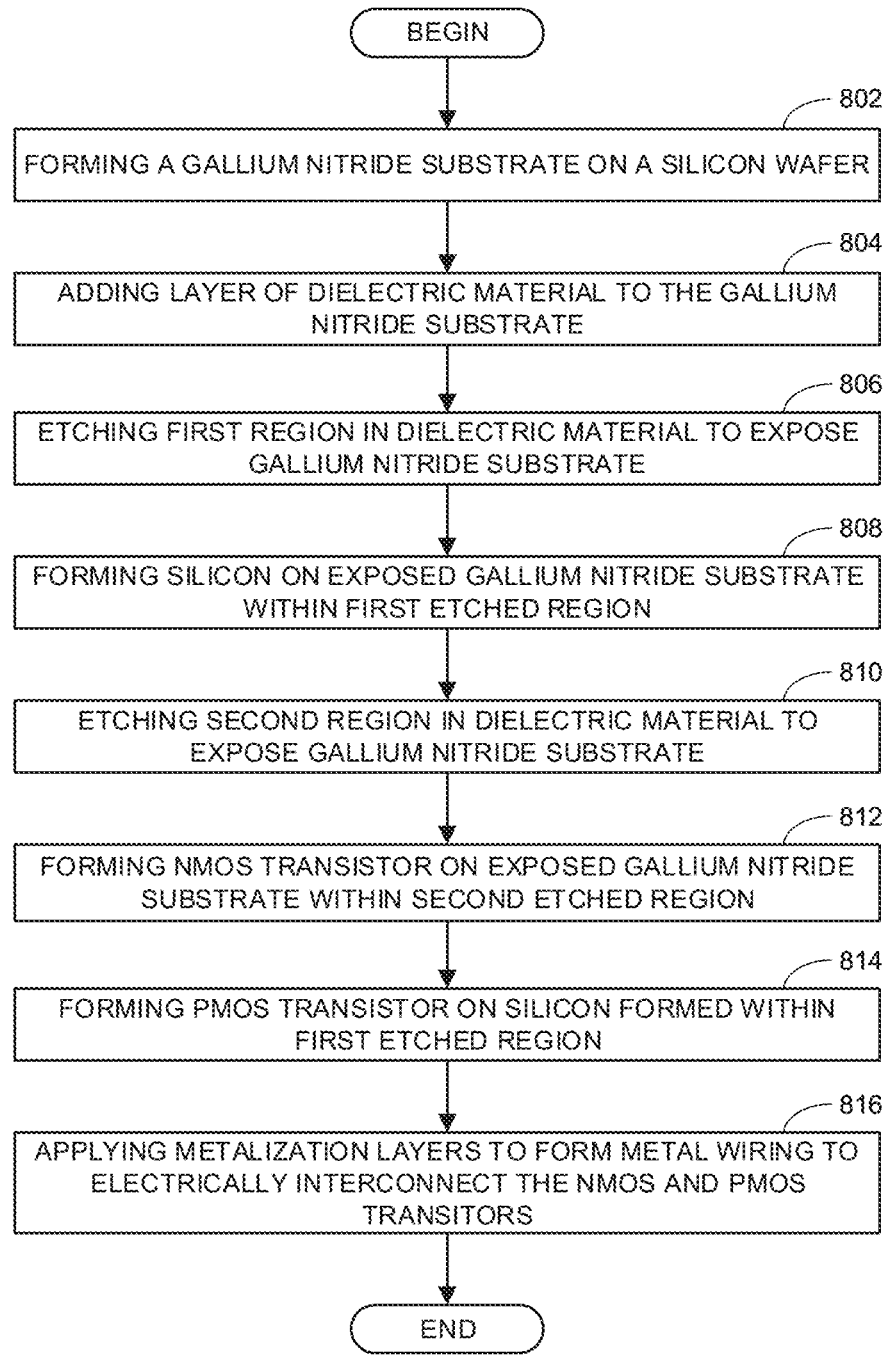
FIG. 8 is a flowchart of an example method to manufacture the example integrated circuit of FIGS. 1-7.

FIG. 8 is a flowchart of an example method to manufacture the example integrated circuit 100 of FIGS. 1-7. The example begins at block 802 by forming a GaN substrate 102 on a Si wafer 104. In some examples, the Si wafer 104 has a surface oriented in the <111> crystal lattice plane. At block 804, a layer of dielectric material 106 is added to the GaN substrate 102. In some examples, the layer of dielectric material 106 has a thickness that is at least twice the width of a Si structure to be formed on the GaN substrate 102 within an etched region 108 of the dielectric material. At block 806, a first region (e.g., the etched regions 108) is etched in the dielectric material 106 to expose the GaN substrate 102. As noted above, the first etched region 106 has an aspect ratio with a height at least twice a width of the region. At block 808, Si 114 is formed within the first etched region 108 on the exposed GaN substrate 102. In some examples, the etched region 108 has a shape corresponding to a fin or pedestal for a transistor. In other examples, additional processing may involve further growth and/or etching of the Si 114 to form one or more additional fins.

At block 810, a second region (e.g., the etched region 119 in FIG. 4) is etched in the dielectric material to expose the GaN substrate 102. At block 812, an NMOS transistor is formed on the exposed GaN substrate 102 within the second etched region 119. At block 814, a PMOS transistor formed on the Si 114 that was previously formed within the first etched region 108. At block 816, metallization layers are applied to form metal wiring 136 to electrically interconnect the NMOS and PMOS transistors. Thereafter, the example method of FIG. 8 ends.

Although the example method is described with reference to the flowchart illustrated in FIG. 8, many other methods of manufacturing the example integrated circuit 100 in accordance with the teachings disclosed herein may alternatively be used. For example, the order of execution of the blocks may be changed, and/or some of the blocks described may be changed, eliminated, or combined. Similarly, additional operations may be included in the manufacturing process before, in between, or after the blocks shown in FIG. 8.

Figure 9:
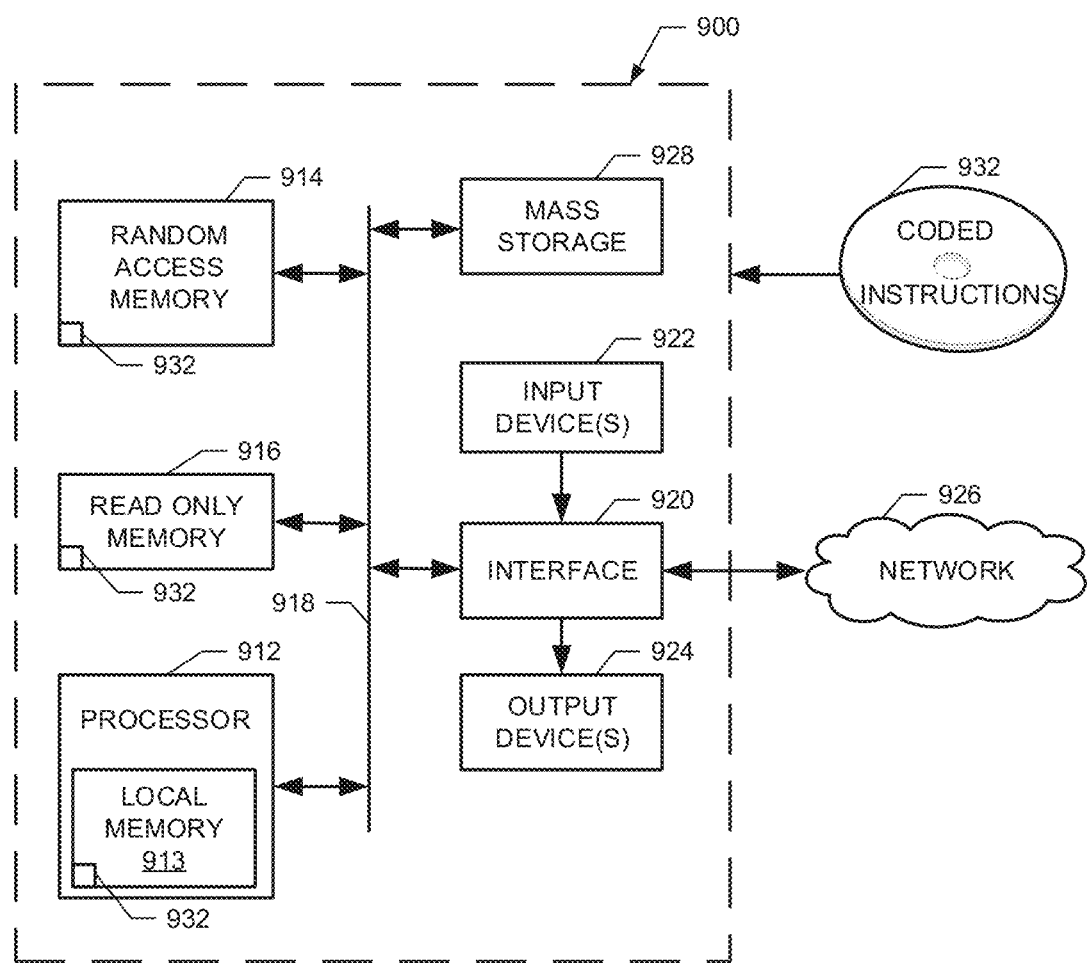
FIG. 9 is a block diagram of an example processor system associated with one or more semiconductor fabrication machines to execute example machine readable instructions represented at least in part by the example method of FIG. 8 to manufacture the example integrated circuit of FIGS. 1-7.

FIG. 9 is a block diagram of an example processor platform 900 capable of controlling one or more semiconductor fabrication machines to execute the method of FIG. 8 to manufacture the integrated circuit 100 of FIGS. 1-7. The processor platform 900 can be any type of computing device.

The processor platform 900 of the illustrated example includes a processor 912. The processor 912 of the illustrated example is hardware. For example, the processor 912 can be implemented by one or more integrated circuits, logic circuits, microprocessors or controllers from any desired family or manufacturer.

The processor 912 of the illustrated example includes a local memory 913 (e.g., a cache). The processor 912 of the illustrated example is in communication with a main memory including a volatile memory 914 and a non-volatile memory 916 via a bus 918. The volatile memory 914 may be implemented by Synchronous Dynamic Random Access Memory (SDRAM), Dynamic Random Access Memory (DRAM), RAMBUS Dynamic Random Access Memory (RDRAM) and/or any other type of random access memory device. The non-volatile memory 916 may be implemented by flash memory and/or any other desired type of memory device. Access to the main memory 914, 916 is controlled by a memory controller.

The processor platform 900 of the illustrated example also includes an interface circuit 920. The interface circuit 920 may be implemented by any type of interface standard, such as an Ethernet interface, a universal serial bus (USB), and/or a PCI express interface.

In the illustrated example, one or more input devices 922 are connected to the interface circuit 920. The input device(s) 922 permit(s) a user to enter data and commands into the processor 912. The input device(s) can be implemented by, for example, an audio sensor, a microphone, a camera (still or video), a keyboard, a button, a mouse, a touchscreen, a track-pad, a trackball, isopoint and/or a voice recognition system.

One or more output devices 924 are also connected to the interface circuit 920 of the illustrated example. The output devices 924 can be implemented, for example, by display devices (e.g., a light emitting diode (LED), an organic light emitting diode (OLED), a liquid crystal display, a cathode ray tube display (CRT), a touchscreen, a tactile output device, a light emitting diode (LED), a printer and/or speakers). The interface circuit 920 of the illustrated example, thus, typically includes a graphics driver card, a graphics driver chip or a graphics driver processor.

The interface circuit 920 of the illustrated example also includes a communication device such as a transmitter, a receiver, a transceiver, a modem and/or network interface card to facilitate exchange of data with external machines (e.g., computing devices of any kind) via a network 926 (e.g., an Ethernet connection, a digital subscriber line (DSL), a telephone line, coaxial cable, a cellular telephone system, etc.).

The processor platform 900 of the illustrated example also includes one or more mass storage devices 928 for storing software and/or data. Examples of such mass storage devices 928 include floppy disk drives, hard drive disks, compact disk drives, Blu-ray disk drives, RAID systems, and digital versatile disk (DVD) drives.

Coded instructions 932 of to implement the method FIG. 8 may be stored in the mass storage device 928, in the volatile memory 914, in the non-volatile memory 916, and/or on a removable non-transitory computer readable storage medium such as a CD or DVD. As used herein, a non-transitory computer readable storage medium is expressly defined to include any type of computer readable storage device and/or storage disk and to exclude propagating signals and to exclude transmission media.

From the foregoing, it will be appreciated that the methods, apparatus and articles of manufacture have been disclosed to enable the use of high voltage transistors formed on a GaN-based semiconductor substrate, which provide benefits in various applications including voltage regulation and RF power amplification. More particularly, examples disclosed herein enable the advantages of GaN-based NMOS transistors while avoiding the poor performance characteristics of GaN-based PMOS transistors by co-integrating GaN NMOS transistors with PMOS transistors on a single substrate. Further, the co-integration of these different transistors is fabricated on a single wafer without significant step height between the different transistor substrates to facilitate and streamline the production of complete circuits (e.g., ICs) on a single chip. This is accomplished by using aspect ratio trapping to form Si on a GaN substrate to arrest defects within a lower portion of the Si and develop desired geometries (e.g., fins) with upper portions that are substantially defect free. This enables the NMOS and PMOS transistors to be in close proximity to facilitate their electrical interconnection, which may be accomplished for both types of transistors at the same time.

Example 1 is an integrated circuit that includes a group III-nitride substrate and a fin of semiconductor material with a cubic crystal structure formed on the group III-nitride substrate. The integrated circuit further includes a first transistor formed on the fin and a second transistor formed on the group III-nitride substrate.

Example 2 includes the subject matter of Example 1, wherein the group III-nitride substrate is formed on a silicon wafer.

Example 3 includes the subject matter of any one of Examples 1 or 2, wherein the integrated circuit further includes metal wiring to electrically interconnect the first and second transistors.

Example 4 includes the subject matter of Example 3, wherein the metal wiring is formed for the first and second transistors at a same time.

Example 5 includes the subject matter of any one of Examples 1-4, wherein the first transistor is a PMOS transistor and the second transistor is an NMOS transistor.

Example 6 includes the subject matter of any one of Examples 1-5, wherein defects in the fin are substantially limited to a lower portion of the fin due to aspect ratio trapping.

Example 7 includes the subject matter of any one of Examples 1-6, wherein the integrated circuit further includes a dielectric material on the group III-nitride substrate. The dielectric material defines an etched region in which the fin is at least partially located.

Example 8 includes the subject matter of Example 7, wherein the dielectric material has a height that is at least twice a width of the etched region.

Example 9 includes the subject matter of Example 8, wherein the width is less than or equal to 10 nanometers.

Example 10 includes the subject matter of any one of Examples 1-9, wherein a height difference between a top surface of the fin and a top surface of the group III-nitride substrate is less than 1 micrometer.

Example 11 includes the subject matter of any one of Examples 1-9, wherein a height difference between a top surface of the fin and a top surface of the group III-nitride substrate is less than 0.1 micrometer.

Example 12 includes the subject matter of any one of Examples 1-11, wherein the group III-nitride substrate is gallium nitride.

Example 13 includes the subject matter of any one of Examples 1-12, wherein the semiconductor material with the cubic crystal structure is at least one of a group IV material or a group III-V material.

Example 14 includes the subject matter of any one of Examples 1-13, wherein the semiconductor material is silicon.

Example 15 is an apparatus that includes a first transistor on a group III-nitride substrate. The apparatus further includes a second transistor on a cubic crystalline substrate. The first and second transistors are associated with a single integrated circuit formed on a single semiconductor wafer.

Example 16 includes the subject matter of Example 15, wherein the group III-nitride substrate is on the semiconductor wafer.

Example 17 includes the subject matter of any one of Examples 15 or 16, wherein the cubic crystalline substrate is on the group III-nitride substrate.

Example 18 includes the subject matter of any one of Examples 15-17, further including a dielectric material on the group III-nitride substrate. The dielectric material defines a trench. The cubic crystalline substrate is on the group III-nitride substrate within the trench.

Example 19 includes the subject matter of Example 18, wherein the trench has a height that is at least twice a width of the trench.

Example 20 includes the subject matter of any one of Examples 15-19, wherein a distance between a top surface of the cubic crystalline substrate and a top surface of the group III-nitride substrate is less than 0.2 micrometers.

Example 21 includes the subject matter of any one of Examples 15-20, wherein metal wiring for the first and second transistors is formed during a same process.

Example 22 includes the subject matter of any one of Examples 15-21, wherein an upper portion of the cubic crystalline substrate is substantially free of defects due to aspect ratio trapping.

Example 23 is a method to manufacture an integrated circuit that includes forming a layer of a dielectric material on a group III-nitride substrate. The method includes etching a trench within the dielectric material to expose a portion of the group III-nitride substrate. The trench having a height that is at least twice a width of the trench. The method further includes forming a layer of a cubic crystalline semiconductor material on the group III-nitride substrate within the trench.

Example 24 includes the subject matter of Example 23, further including forming the group III-nitride substrate on a semiconductor wafer.

Example 25 includes the subject matter of any one of Examples 23 or 24, wherein the trench is dimensioned to limit propagation of defects within the cubic crystalline semiconductor material to a lower portion of the cubic crystalline semiconductor material.

Example 26 includes the subject matter of any one of Examples 23-25, wherein a height difference between a top surface of the cubic crystalline semiconductor material and a top surface of the group III-nitride substrate is less than 0.1 micrometer.

Example 27 includes the subject matter of any one of Examples 23-26, wherein the method further includes forming a first transistor on the layer of the cubic crystalline semiconductor material, and forming a second transistor on the group III-nitride substrate.

Example 28 includes the subject matter of Example 27, wherein the first transistor is a PMOS transistor and the second transistor is an NMOS transistor.

Example 29 includes the subject matter of any one of Examples 27 or 28, further including adding metal wiring to electrically interconnect the first and second transistors.

Example 30 includes the subject matter of Example 29, wherein the metal wiring for both the first and second transistors is added during a same process.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:
1. An integrated circuit comprising:
    a silicon substrate comprising a planar surface oriented in a <111> crystal lattice plane;
    a group III-nitride layer in contact with the surface of the silicon substrate;
    a fin of semiconductor material with a cubic crystal structure in contact with the group III-nitride layer, the fin comprising a height of the fin that is not less than twice a width of the fin;
    a first transistor comprising a first gate dielectric, the first gate dielectric on and in direct contact with the fin; and
    a second transistor comprising a second gate dielectric, the second gate dielectric on and in direct contact with the group III-nitride layer,
    wherein a bottom surface of the second gate dielectric is below any surface of the first gate dielectric.
2. The integrated circuit of claim 1, wherein the group III-nitride layer comprises a crystallinity epitaxial to a crystallinity of the surface of the silicon substrate.
3. The integrated circuit of claim 2, wherein the group III-nitride layer has a thickness of not less than 2 micrometers between the fin and the surface of the silicon substrate and between the second transistor and the surface of the silicon substrate.
4. The integrated circuit of claim 1, wherein the group III-nitride layer comprises a plurality of intermediate layers between the surface of the silicon substrate and a top surface of the group III-nitride layer.
5. The integrated circuit of claim 4, wherein the plurality of intermediate layers are between the fin and the surface of the silicon substrate and between the second transistor and the surface of the silicon substrate.

6. The integrated circuit of claim 1, wherein the fin is on a first region of the group III-nitride layer and the second transistor is on a second region of the group III-nitride layer, the first and second regions being immediately adjacent regions of the group III-nitride layer.

7. The integrated circuit of claim 1, further comprising: a dielectric material on the group III-nitride layer, wherein the fin is in a trench of the dielectric material, a first gate of the first transistor is over the dielectric material, and a portion of a second gate of the second transistor is laterally adjacent the dielectric material.

8. The integrated circuit of claim 7, wherein the width is less than or equal to 10 nanometers.

9. The integrated circuit of claim 1, wherein a height difference between a top surface of the fin and a top surface of the group III-nitride layer is less than 200 nanometers.

10. The integrated circuit of claim 1, wherein the group III-nitride layer is gallium nitride and the semiconductor material is at least one of a group IV material or a group III-V material.

11. The integrated circuit of claim 10, wherein the semiconductor material comprises silicon.

12. The integrated circuit of claim 1, further comprising:
a first contact coupled to a first source or drain of the first transistor; and
a second contact coupled to a second source or drain of the second transistor, wherein the first and second contacts comprise a same material.

13. The integrated circuit of claim 1, wherein the fin comprises a lower portion adjacent to the group III-nitride layer and an upper portion adjacent to the lower portion, wherein the lower portion comprises more defects than the upper portion.

14. The integrated circuit of claim 13, wherein the lower portion comprises a lower portion height that is not less than twice the width of the fin.

* * * * *